(12) United States Patent
Lin et al.

(10) Patent No.: US 6,489,196 B1
(45) Date of Patent: Dec. 3, 2002

(54) METHOD OF FORMING A CAPACITOR WITH HIGH CAPACITANCE AND LOW VOLTAGE COEFFICIENT

(75) Inventors: Ming-Yu Lin, Kaohsiung (TW); Hsueh-Wen Wang, Hsin-Chu (TW)

(73) Assignee: United Electronics Corp. (TW)

( * ) Notice: Subject to any disclaimer, the term of this patent is extended or adjusted under 35 U.S.C. 154(b) by 0 days.

(21) Appl. No.: 10/055,943

(22) Filed: Jan. 28, 2002

(51) Int. Cl.$^7$ ............................................. H01L 21/8242
(52) U.S. Cl. ...................... 438/239; 438/252; 438/395
(58) Field of Search ................................ 438/239, 247, 438/250, 251, 252, 253, 393, 394, 395, 396

(56) References Cited

U.S. PATENT DOCUMENTS

| | | |
|---|---|---|
| 4,731,696 A | 3/1988 | Himes et al. |
| 5,016,070 A | 5/1991 | Sundaresan |
| 5,389,832 A | 2/1995 | Boestler et al. |
| 5,521,111 A | 5/1996 | Sato |
| 6,037,219 A * | 3/2000 | Lin et al. ..................... 438/255 |

* cited by examiner

Primary Examiner—Chandra Chaudhari
Assistant Examiner—Jack Chen
(74) Attorney, Agent, or Firm—Powell Goldstein Frazer & Murphy LLP

(57) ABSTRACT

The present invention provides a method of forming a capacitor in an integrated circuit. The method comprises providing a semiconductor substrate having a conductive layer thereon. The partial conductive layer is removed to form an electrode. A plurality of first dopants are implanted on a surface of the electrode to form a first doped region. Then a plurality of second dopants are implanted into the electrode to form a second doped region below the first doped region. Then the capacitor is formed comprising the electrode. The first doped region and the second region can reduce voltage coefficient as well as increase capacitance of the capacitor.

12 Claims, 3 Drawing Sheets

| Condition | Voltage Cofficient(ppm/v) | Capacitance (IE-5pf/um²) |
|---|---|---|
| 1 | 489.01 | 68.71 |
| 2 | 1390.35 | 165.23 |
| 3 | 301.45 | 155.25 |

FIG.2

METHOD OF FORMING A CAPACITOR WITH HIGH CAPACITANCE AND LOW VOLTAGE COEFFICIENT

BACKGROUND OF THE INVENTION

1. Field of the Invention

The present invention relates to a method of forming semiconductor device, and more particularly relates to a method of forming a capacitor with high capacitance and low voltage coefficient.

2. Description of the Prior Art

As is well known, the capacitance of a parallel plate capacitor is normally a function only of the area of the electrodes, the dielectric constant of the dielectric and the thickness of the dielectric. This assumes that both electrodes are metallic conductors. When one of the electrodes is a semiconductor and is formed at the semiconductor-dielectric interface, even in the absence of any externally applied voltage bias, the capacitance of such a structure is somewhat lower than both metallic electrodes. When voltage is applied across the above described device's plates, the depletion layer in the semiconductor grows or shrinks, depending on the polarity, thereby reducing or increasing the measured capacitance. In other words, such a device has a high voltage coefficient, in some cases as high as 120 ppm/volt. This is not a problem in many integrated circuits, but this cannot be tolerated in many analog circuits (such as analog to digital converters, for example).

During the manufacture of integrated circuits where capacitors must be included, it has been common practiced to form capacitors in integrated circuits by sandwiching a layer of the silicon oxide known as IPO (or inter-poly oxide) between two layers of polysilicon. In earlier processes such as the standard 0.5 micron mixed-mode process, the two polysilicon layers used for the capacitors were sufficiently heavily doped so that they were electrically degenerate (that is, they exhibited metallic conductivity) and any depletion layer formed at the silicon-dielectric interface would be negligibly thin. More recently, with the development of the 0.35 micron process, changes in processing parameters make the polysilicon layers less heavily doped.

A number of prior art references describe capacitors for incorporation within integrated circuits but most do not address the voltage coefficient issue. Boerstler et al. (U.S. Pat. No. 5,389,832, February 1995) describe capacitors formed from forward biased diodes. Sundaresan (U.S. Pat. No. 5,016,070, May 1991) describes a stacked CMOS SRAM with cross-coupled capacitors. Sato (U.S. Pat. No. 5,211,111, May 1996) teaches use of a trench-stacked capacitor. Himes et al. (U.S. Pat. No. 4,731,696, March 1988) address the voltage coefficient issue and disclose a three plate capacitor structure wherein two layers of dielectric are sandwiched between three conductive plates, the center plate being the semiconductor. Voltage is applied between the center plate and the two outer plates (which are connected to each other).

While this structure should exhibit low voltage coefficient, it requires three separate deposition steps for the electrodes and two separately deposited dielectric layers. The latter limitation can lead to serious problems in the absence of precise thickness and process control during deposition of the two dielectric layers. It also means that the standard manufacturing process will have to be modified if this structure is to be made part of an integrated circuit.

SUMMARY OF THE INVENTION

It is an object of the invention to provide a method of forming a capacitor in an integrated circuit. Lightly doping implemented on the top surface of a bottom electrode can improve the capacitance of the capacitor.

It is another object of the invention to provide a method of forming a plate capacitor. Heavily doping implemented in the center region of a bottom electrode can reduce the voltage coefficient of the plate capacitor.

The present invention provides a method of forming a capacitor in an integrated circuit. The method comprises providing a semiconductor substrate having a conductive layer thereon. The partial conductive layer is removed to form an electrode. A plurality of first dopants are implanted on a surface of the electrode to form a first doped region. Then a plurality of second dopants are implanted into the electrode to form a second doped region below the first doped region. Then the capacitor is formed comprising the electrode. The first doped region and the second region can reduce voltage coefficient as well as increase capacitance of the capacitor.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 2 is a chart illustrating the voltage coefficients and the capacitances in comparisons among two methods of prior art and one of the present invention.

DESCRIPTION OF THE PREFERRED EMBODIMENT

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Accordingly, application of the present invention is not intended to be limited to those devices fabricated in silicon semiconductor materials, but will include those devices fabricated in one or more of the available semiconductor materials.

The present invention provides a method of reducing voltage coefficient and increasing capacitance of a capacitor. The method comprises providing a substrate having a conductive layer thereon. The conductive layer is etched to form a bottom electrode of the capacitor. A first doped region is formed in the bottom electrode and a second doped region is formed in the bottom electrode, wherein the second doped region is below the first doped region.

Figure 1A:
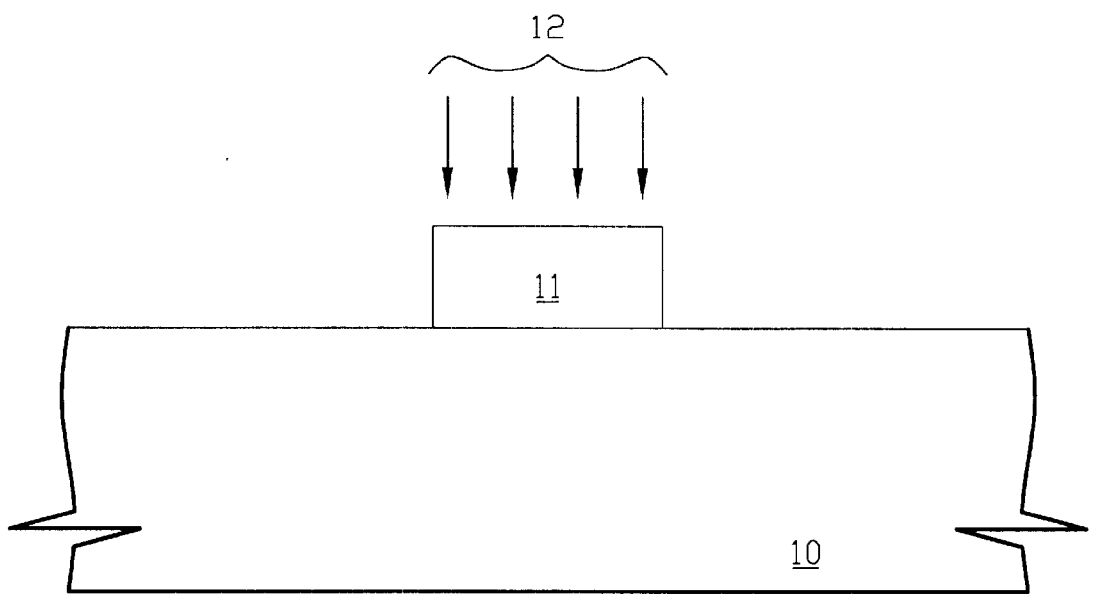
FIGS. 1A–1D are the series cross-sectional schematic diagrams illustrating the formation of a capacitor in an integrated circuit in accordance with the present invention.

In FIG. 1A, a substrate 10 or semiconductor wafer is provided. There may be devices, such as isolation devices, or regions, such as wells, in the substrate 10 and not shown in FIG. 1A. Of course, there also may be some layers, such as a pad oxide layer or thermal oxide layer, formed over the substrate 10 and not shown in FIG. 1A. A conductive layer (Poly 0), such as a polysilicon layer, is then deposited over the substrate 10, whereby is subsequently etched to form the bottom electrode 11 of a capacitor.

Figure 1B:
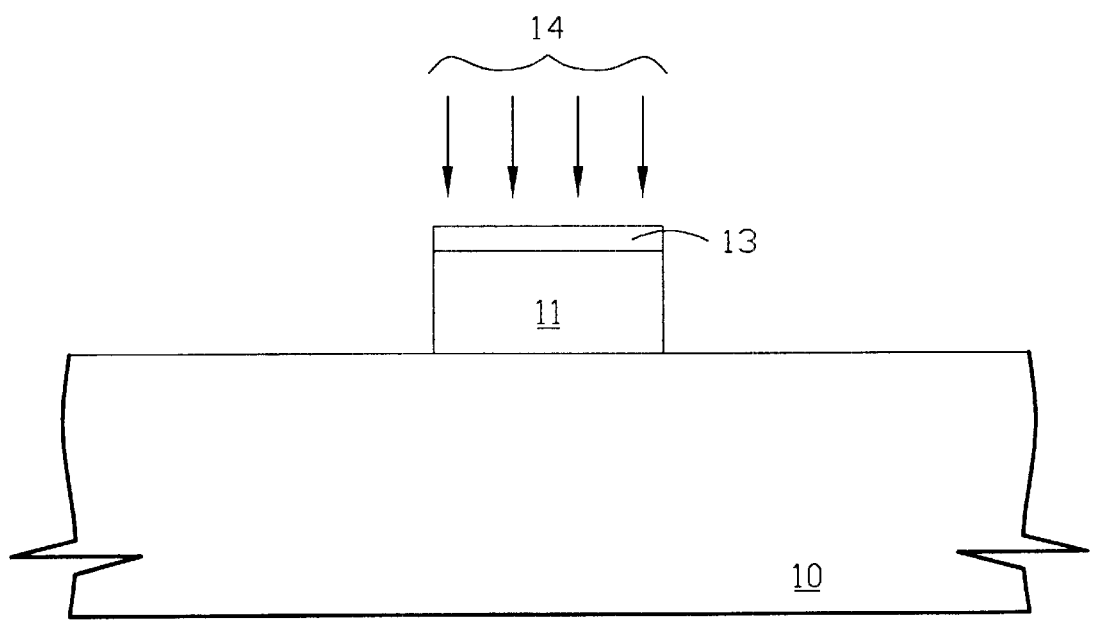

Next, a step that is a key feature of the present invention, lightly doping implantation 12 is implemented on the top surface of the bottom electrode 11, is undertaken. Thus a lightly doped region 13 is exhibited on the top surface of the bottom electrode 11, shown in FIG. 1B. The lightly doped region 13 on the top surface is advantageous for a capacitor to increase the capacitance of the capacitor. In an embodiment of the present invention, light dopants, such as phosphorus ions, are used in the lightly doping implantation 12 with a dosage about 1E15 to 1E16 atoms/cm$^2$ and energy about 20 to 40 KeV. The next step defines another key feature of the present invention, which is the heavily doping implantation 14 is implemented in the bottom electrode 11. In the embodiment, heavy dopants, such as arsenic ions, are used in the heavily doping implantation 14 with a dosage about 1E14 to 1E15 atoms/cm$^2$ and energy about 10 to 200 KeV.

Figure 1C:
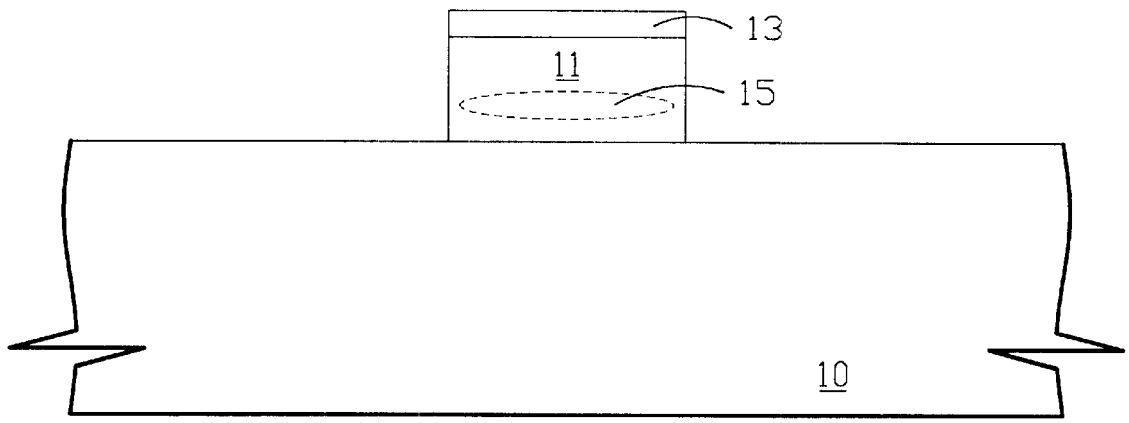

Different from lightly doping implantation 12, dopants in the heavily doping implantation 14 are implanted more deeply in the bottom electrode 11 than dopants in the lightly doping implantation 12. A heavily doped region 15 is exhibited in the body region of the bottom electrode 11, shown in FIG. 1C. The heavily doped region 15 is advantageous for the capacitor to reduce the resistance of the bottom electrode 11 on consideration of no degradation of capacitance. Thus, the voltage coefficient of the bottom electrode 11 reduced by existence of heavily doped region 15 in the center region of the bottom electrode 11. On the other hand, the capacitance of the bottom electrode 11 is increased by existence of lightly doped region 13 on the top surface of the bottom electrode 11.

Figure 1D:
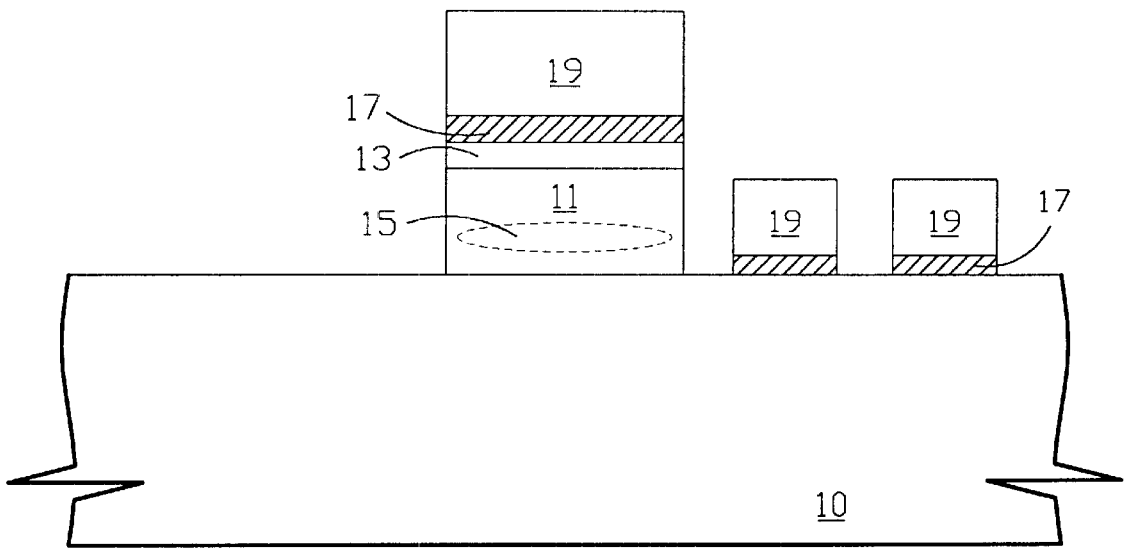

Next, a dielectric layer 17, such as an oxide layer, is formed over the substrate 10 and another conductive layer 19, such as a polysilicon layer, is formed thereafter. The dielectric layer 17 and the conductive layer 19 are subsequently etched to form the top electrode of the capacitor and other semiconductor devices on the substrate 10, as shown in FIG. 1D.

FIG. 2 is a chart illustrating the voltage coefficients and the capacitances in comparisons among two methods of prior art and one of the present invention. Condition 1 is heavily doping implantation implemented on the surface of a bottom electrode. Condition 2 is lightly doping implantation implemented on the surface of a bottom electrode. Condition 3 is heavily doping implantation in a bottom electrode and lightly doping implantation on the surface of a bottom electrode in accordance with the present invention. Thus, it is obvious that the voltage coefficient is reduced as well as the capacitance is increased in accordance with the present invention.

Of course, it is to be understood that the invention need not be limited to these disclosed embodiments. Various modifications and similar changes are still possible within the spirit of this invention. In this way, the scope of this invention should be defined by the appended claims.

What is claimed is:

1. A method of forming a capacitor in an integrated circuit, said method comprising:

providing a semiconductor substrate having a conductive layer thereon;

removing partial said conductive layer to form an electrode;

implanting a plurality of first dopants on a surface of said electrode to form a first doped region;

implanting a plurality of second dopants into said electrode to form a second doped region below said first doped region; and forming said capacitor comprising said electrode.

2. The method according to claim 1, wherein said conductive layer comprises a polysilicon layer.

3. The method according to claim 1, wherein said first dopants have a dosage lightly than said second dopants have.

4. The method according to claim 1, wherein said first dopants comprise phosphorus ions.

5. The method according to claim 1, wherein said second dopants comprise arsenic ions.

6. A method of reducing voltage coefficient and increasing capacitance of a capacitor, said method comprising:

providing a substrate having a conductive layer thereon;

etching said conductive layer to form a bottom electrode of said capacitor;

forming a first doped region in said bottom electrode; and forming a second doped region in said bottom electrode, wherein said second doped region is below said first doped region.

7. The method according to claim 6, wherein said first doped region is located near a top surface of said bottom electrode.

8. The method according to claim 6, wherein said first doped region is formed by implanting a plurality of phosphorus ions with a dosage in the range of 1E15 and 1E16 atoms/cm$^2$.

9. The method according to claim 6, wherein said second doped region is located in a center region of said bottom electrode.

10. The method according to claim 6, wherein said second doped region is formed by implanting a plurality of arsenic ions with a dosage in the range of 1E14 and 1E15 atoms/cm$^2$.

11. The method according to claim 6, wherein said conductive layer comprises a polysilicon layer.

12. The method according to claim 6 further comprising:

forming a dielectric layer on said bottom electrode; and forming a polysilicon layer on said dielectric layer to form a top electrode.

* * * * *